US006937469B2

(12) United States Patent
Muennich

(10) Patent No.: US 6,937,469 B2
(45) Date of Patent: Aug. 30, 2005

(54) INSERT MODULE WITH PERMEABLE SEPARATION UNIT ADAPTED FOR COOLING REQUIREMENT

(75) Inventor: Christian Muennich, Schwaebisch Gmuend (DE)

(73) Assignee: Agilent Technologies, Inc., Palo Alto, CA (US)

( * ) Notice: Subject to any disclaimer, the term of this patent is extended or adjusted under 35 U.S.C. 154(b) by 200 days.

(21) Appl. No.: 10/638,616

(22) Filed: Aug. 11, 2003

(65) Prior Publication Data

US 2004/0100774 A1 May 27, 2004

(30) Foreign Application Priority Data

Oct. 29, 2002 (EP) .............................. 02024081

(51) Int. Cl.[7] ................................................ H05K 7/20
(52) U.S. Cl. ....................... 361/690; 361/694; 361/695; 361/698; 454/184
(58) Field of Search .............................. 165/80.3–80.4, 165/185; 361/688–698, 728, 730, 725–727; 454/184

(56) References Cited

U.S. PATENT DOCUMENTS

| 3,967,874 | A | | 7/1976 | Calabro .................. 339/112 R |
|---|---|---|---|---|
| 4,644,443 | A | | 2/1987 | Swensen et al. ............ 361/384 |
| 4,821,145 | A | * | 4/1989 | Corfits et al. ............... 361/692 |
| 4,977,532 | A | | 12/1990 | Borkowicz et al. ......... 364/708 |
| 5,027,254 | A | * | 6/1991 | Corfits et al. ............... 361/694 |
| 5,523,917 | A | | 6/1996 | Searby ....................... 361/687 |
| 5,923,532 | A | | 7/1999 | Nedved ...................... 361/690 |
| 5,940,266 | A | * | 8/1999 | Hamilton et al. ........... 361/695 |
| 5,940,288 | A | * | 8/1999 | Kociecki .................... 303/144 |
| 6,058,011 | A | | 5/2000 | Hardt et al. ................ 361/694 |

FOREIGN PATENT DOCUMENTS

| DE | 4035211 A1 | 5/1992 |
|---|---|---|
| EP | 0810511 A1 | 12/1997 |
| EP | 1017263 A2 | 7/2000 |

* cited by examiner

Primary Examiner—Gregory Thompson

(57) ABSTRACT

An insert module includes a housing having a component area for bearing one or more components, and a channel area communicating with at least one of an entrance and an exit of a cooling medium flow. The insert module provides at least a part of a flow path of the cooling medium flow, where the cooling medium enters the insert module through the entrance, flows at least partly through the insert module at least partly passing the component area, and at least partly exits the insert module through the exit. At least one permeable separation unit is adapted for separating the component area from the channel area and includes at least one permeable and at least one impermeable portion. An allocation of the at least one permeable and the at least one impermeable portion is adapted to the cooling requirements of the components arranged within the component area.

23 Claims, 3 Drawing Sheets

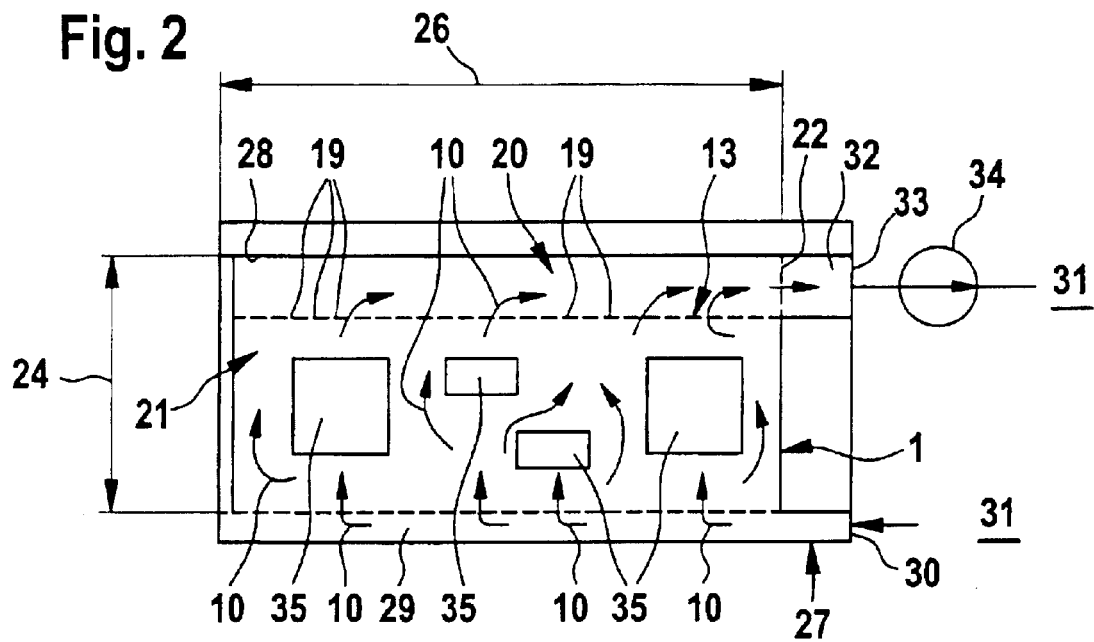
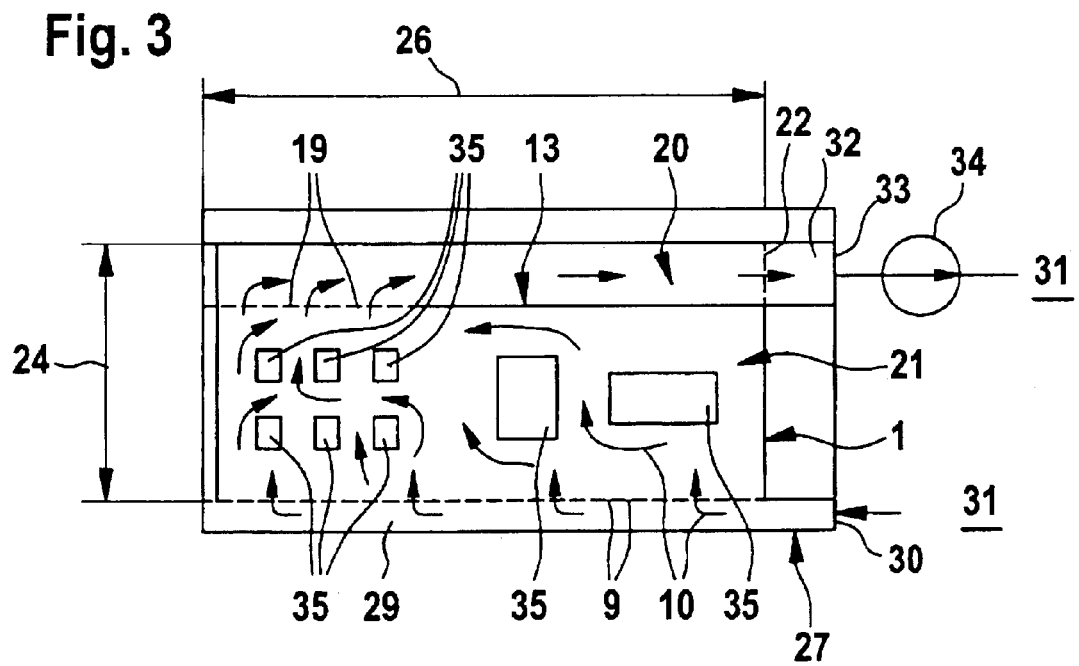

INSERT MODULE WITH PERMEABLE SEPARATION UNIT ADAPTED FOR COOLING REQUIREMENT

BACKGROUND OF THE INVENTION

The present invention relates to an insert module adapted for inserting into a device, wherein said device is adapted for receiving or generating a cooling medium flow, e.g. from or by means of a fan or blower.

Such insert module normally comprises a housing, in which electronic and/or optical components like e.g. measurement equipment, computer, semiconductors, microprocessors, memory are arranged. During operation, the components of the insert module usually generate heat, which has to be transported out of the housing to prevent the components from overheating. To this aim the housing comprises an entrance and an exit for the cooling gas flow of the measurement device. When the insert module is inserted into the housing, the insert module is integrated into a flow path of the cooling gas flow. During operation of the measurement device, the cooling gas flow enters the inserted insert module through the entrance, then flows through the insert module, thereby passing and thus cooling the components, and then leaves the insert module through the exit.

U.S. Pat. No. 3,967,874 discloses a uniformly cooled printed circuit board mounting assembly.

SUMMARY OF THE INVENTION

It is an object of the present invention to provide an improved insert module. The object is solved by the independent claim. Preferred embodiments are shown by the dependent claims.

Since different insert modules contain varying electronic and/or optical equipment, different insert modules may have varying cooling requirements.

To adapt the internal cooling medium flow within the housing to the specific cooling requirements, it may be suitable to select an applicative design and/or configuration and/or positioning for the entrance and/or the exit of the housing. As the entrance and the exit are members of the housing, different insert modules may need varying housings. These circumstances increase the manufacturing costs of the insert modules.

By means of at least one permeable (preferably removable and/or exchangeable) separation unit, which is preferably provided by a separation wall, the housing is provided with a component area and a channel area. The permeability of the separation unit is preferably provided by a suitable porosity or perforation. As the component area serves for housing the electronic and/or optical components of the insert module, the channel area provides an inlet channel communicating with the housings entrance or an outlet channel communicating with the housings exit, respectively. In other words, an inlet channel or an outlet channel is integrated into the housing of the insert module according to the present invention. By use of different separation units the same housing can be adapted for varying equipment and/or for varying cooling requirements. To this aim, there only have to be provided different separation units, whereas the housings remain unchanged. Consequently, different insert modules need only one housing-type and thus materials management in the line of production of the insert modules can be simplified and therefore the manufacturing costs of the insert modules can be reduced.

The separation units may be adapted to the specific cooling requirements by selected design, dimensions, shapes and/or materials. In a preferred embodiment the separation units are adapted to the specific cooling requirements of the electronic components by selecting an applicatively designed permeability or porosity or perforation. By using a well directed design for the permeability (porosity/perforation) the internal cooling gas flow within the housing can be targeted to hot spots, e.g. components like microprocessors requiring an intensive cooling.

To simplify the mounting of the insert module according to the invention, the separation unit is supported by a support comprising two longitudinal grooves, which face each other and in which the separation unit is inserted at its edges. In this embodiment the housing has an outer side wall adapted for providing a removable cap, whereby the removed cap provides an opening, through which the separation unit can be inserted into the grooves and be removed out of the grooves. The removable cap and the groove-support provide a simple mounting and dismounting of the separation unit and in particular allow a conversion of the respective insert module into another insert module with another measurement equipment having varying cooling requirements.

According to a preferred embodiment a portion of the housing comprises the channel area and a support adapted for supporting the separation unit, whereas said portion of the housing is formed in one piece. With help of this construction, the housing with the integrated channel or channel area, respectively, can be manufactured with reduced costs. To achieve comparatively small production costs, the one-piece portion of the housing may e.g. be provided by an extrusion molding process.

A further advantage of the inventive insert module can be seen in an embodiment, wherein the separation unit is removed or has a length less than the length of the channel area, and wherein at least one component arranged in the component area extends into the channel area. With help of this design it is possible to equip the housing with large components, that usually can not be completely arranged in the components area or even can not be arranged in a housing of a usual insert module. Obviously, only such components may extend into the channel area that do not need intensive cooling or any cooling at all.

BRIEF DESCRIPTION OF THE DRAWINGS

Other objects and many of the attendant advantages of the present invention will be readily appreciated and become better understood by reference to the following detailed description when considered in connection with the accompanying drawings. Features that are substantially or functionally equal or similar will be referred to with the same reference sign(s).

FIGS. 2–4 depict longitudinal sections through different embodiments of the insert module in a simplified manner.

DETAILED DESCRIPTION OF PREFERRED EMBODIMENTS ACCORDING TO THE INVENTION

Figure 1:
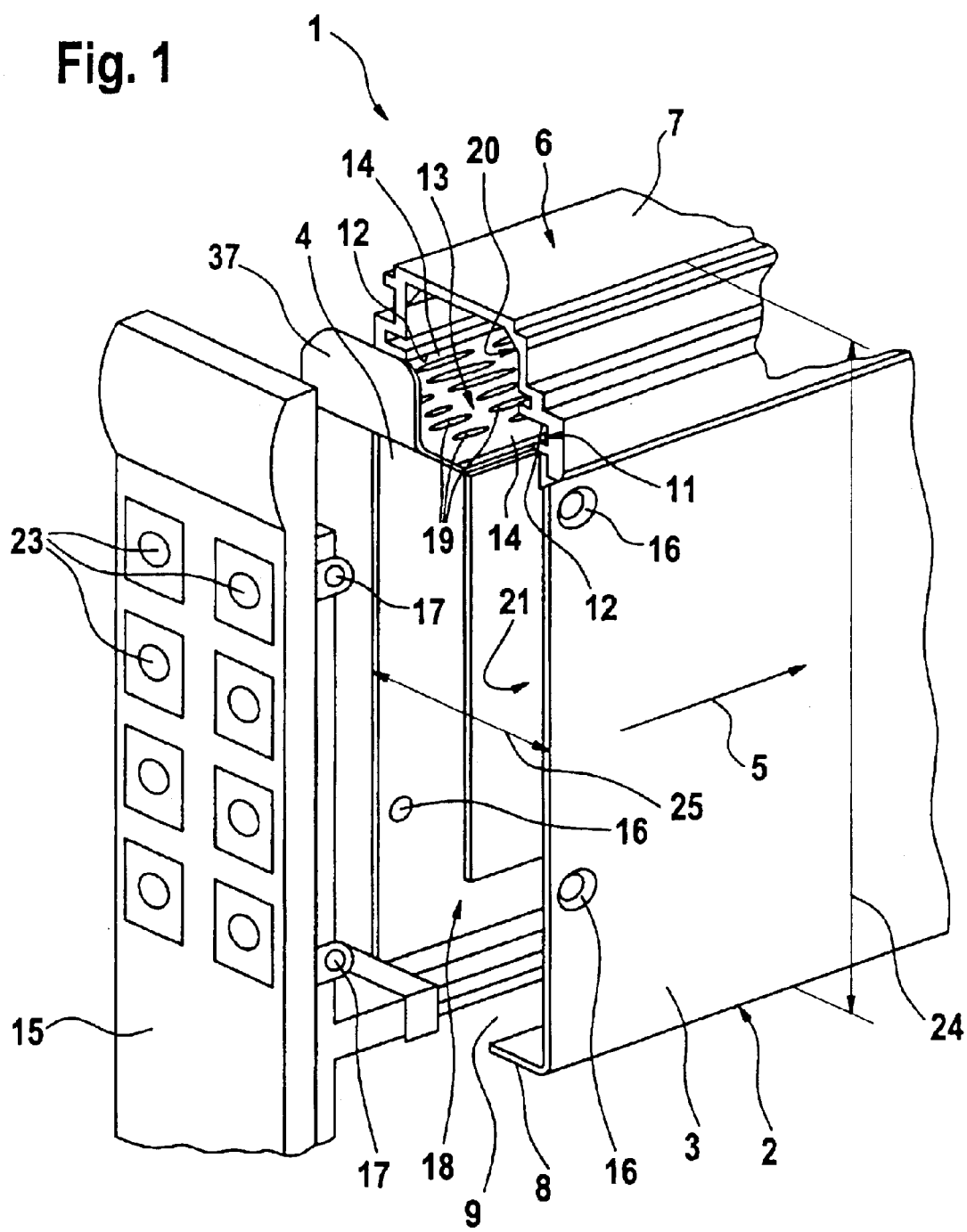
FIG. 1 depicts a front portion of an insert module according to the present invention in an isometric view.

Referring to FIG. 1 an insert module 1 according to the present invention comprises a housing 2 with two parallel side walls 3 and 4 extending into a longitudinal direction of the housing 2. In FIG. 1 said longitudinal direction is symbolized by an arrow 5. The housing 2 comprises a portion 6, which forms or comprises in the shown example an upside 7 of the housing 2. The portion 6 is preferably made in one piece, e.g. by extrusion molding. At least one of the side walls 3, 4, here the side wall 4 turned away from the viewer, may be fabricated as an integral part of the one-piece portion 6. Therefore, the portion 6 comprises two adjacent side walls of the housing 2, namely said side wall 4 and the upside 7. Opposite to the upside 7 the housing 2 has an underside 8 comprising an opening 9. This opening 9 preferably provides an entrance of the housing 2, through which a cooling medium flow (in the FIGS. 2 to 4 designated with 10) may enter the housing 2. Apparently, the opening 9 alternatively may be used as an exit of the housing 2, through which the cooling gas flow 10 may leave the housing 2.

The cooling medium used for the cooling medium flow 10 may preferably be a cooling gas, preferably air, but also the use of a cooling liquid, preferably water, is possible.

The one-piece portion 6 of the housing 2 comprises a support 11, which is an integral member of the portion 6. Said support 11 comprises two opposing grooves 12, of which only the one turned to the viewer is visible. The grooves 12 extend parallel to the longitudinal direction 5 of the housing 2. By means of its grooves 12 the support 11 is adapted for supporting a separation unit 13, which can be inserted into the housing 2. In the depicted preferred embodiment the separation unit is provided by a separation wall 13. When inserting the separation wall 13 into the housing 2, opposing edges 14 of the separation wall 13 extend into the grooves 12. Therefore, the separation wall 13 can be slotted into the grooves 11 in the longitudinal direction 5 of the housing 2.

As depicted in FIG. 1 the housing 2 comprises at its front portion a front side member or wall 15, which is removable from the housing 2. To this aim the front side wall 15 may be attachable to the housing 2 by means of screws not shown. To fix the front side wall 15 to the housing 2 the screws pass through openings 16 of the housing 2 and engage threads 17 of the front side wall 15. Therefore, the front side wall 15 provides a removable cap in the following also designated with 15. Since the cap 15 is removed from the housing 2, the housing 2 has a front opening 18, which is in FIG. 1 turned to the viewer and through which the separation wall 13 may be inserted into the supporting grooves 12 or may be removed out of the grooves 12, respectively. Therefore, the separation wall 13 is removable and exchangeable through the front opening 18 by means of the removable cap 15.

According to the present invention the separation wall 13 is permeable for the cooling medium. This permeability may be provided by a suitable porosity or perforation. The respective permeability or porosity or perforation is designated with 19 and is e.g. provided by means of various openings or holes, which may be all of the same or of different shapes. Obviously, in another embodiment such a perforation 19 may be provided by means of a single opening.

The separation wall 13 is adapted for separating within the housing 2 a channel area 20 from a component area 21. Since in the shown embodiment the support 11 is integrated into the one-piece portion 6, the channel area 20 consequently is provided within the portion 6, whereas the component area 21 fills out the remaining volume of the housing 2. The channel area 20 communicates with an opening not visible in FIG. 1 but designated with 22 in the FIGS. 2 to 4. Preferably said opening 22 provides an exit of the housing 2, through which the cooling gas flow 10 (see FIGS. 2 to 4) may leave the housing 2. The channel area 20 then provides an outlet channel. Apparently, the opening 22 alternatively may be used as the entrance of the housing 2, through which the cooling gas flow 10 may enter the housing 2. Consequently, the channel area 20 then provides an inlet channel.

The component area 21 of the housing 2 is adapted for receiving components, in particular electronic and/or optical components, measurement apparatus or measurement equipment. Said components are designated with 35 in the FIGS. 2 to 4. Electronic components may also include optical components. In particular, the front side wall 15 shows several electronic and/or optical connectors 23 providing input and/or output interfaces for the components 35 arranged within the housing 2 or within the components area 21, respectively.

In the embodiment according to FIG. 1 the separation wall 13 comprises at its front end turned to the viewer an end segment 37 bent perpendicularly to the remaining separation wall 13. This end segment 37 is adapted for closing the front end of the channel area 20.

According to FIG. 1 the housing 2 preferably has a height 24, which is greater than the housings breadth indicated with 25. Now referring to the FIGS. 2 to 4 the housing 2 preferably has a length 26, which is greater than the housings height 24. Therefore, the housing 2 has a long and flat shape. Advantageously, the channel area 20 extends underneath the upside 7 and alongside the housings breadth 25 (cf. FIG. 1) and the housings length 26. Although the example is preferred, other arrangements of the channel area 20 are obviously possible and within the scope of the present invention.

Figure 4:
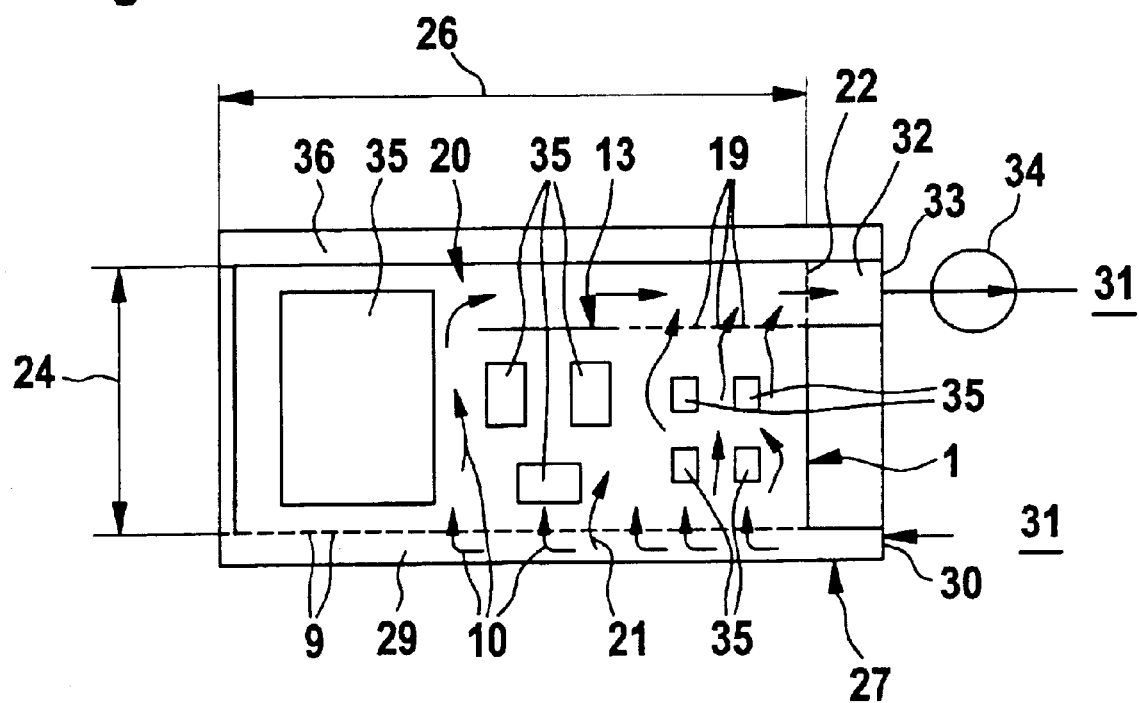

According to the FIGS. 2 to 4 the respective insert module 1 is adapted to be inserted into a device, preferably into a modular measurement device 27, comprising at least one slot 28, each adapted for inserting such an insert module 1. The measurement device 27 provides an inlet chamber 29 below the underside 8 of the housing 2 of the inserted insert module 1. Said inlet chamber 29 communicates through an inlet 30 of the measurement device 27 with a surrounding 31 of the measurement device 27. The measurement device 27 also comprises an outlet chamber 32 communicating with an outlet 33 of the measurement device 27. This outlet 33 is connected to a suction side of a fan or blower 34, which may be an external blower 34 or a blower 34 integrated into the measurement device 27. The pressure side of the blower 34 communicates with the surrounding 31. During its operation the blower 34 generates the cooling gas flow 10 following a flow path established between inlet 30 and outlet 33 within the measurement device 27.

Since the insert module 1 is inserted into the measurement device 27 the entrance 9 of the housing 2 communicates with the inlet chamber 29 and the exit 22 of the housing 2 communicates with the outlet chamber 32. Therefore, the insert module 1 or its housing 2, respectively, is integrated into the aforementioned flow path of the cooling gas flow 10. During operation of the measurement device 27 or its blower 34, respectively, the cooling gas flow 10 enters the housing 2 via inlet 30, inlet chamber 29 and entrance 9. Within the component area 21 of the housing 2 the cooling gas flow 10 passes the components 35 and thus provides a cooling of the components 35. After passing and cooling the components 35 the cooling gas flow 10 leaves the component area 21, flows through the perforation 19 of the separation wall 13 and enters the channel area 20. In this example the channel area 21 provides an outlet channel leading to the exit 22 of the housing 2. At the exit 22 the cooling gas flow 10 enters the outlet chamber 32. The blower 34 drives the cooling gas flow 10 from the outlet chamber 32 through the outlet 33 to the environment or surrounding 31.

Different insert modules 1 may be equipped with different or varying combinations of the components 35. Varying equipment may have different cooling requirements. Preferably, the design of the permeability or, respectively, the perforation 19 of the separation wall 13 is adapted to the specific cooling requirements of the respective component arrangement. Since the separation wall 13 can easily be removed or exchanged the effort for adapting the insert module 1 to a specific application is relatively small. Therefore, different types of insert modules 1 have the same housing 2 but separation walls 13 with different perforations 19.

In the examples of the FIGS. 2 to 4 the insert modules 1 have different separation walls 13 or, respectively, have separation walls 13 with different perforations 19. According to different parameters, like arrangement, position, shape and dimension, the perforation 19 affects the cooling gas flow 10 within the component area 21. Referring to FIG. 2 all components 35 need cooling, therefore, the perforation 19 affects the cooling gas flow 10 to pass all components 35. Referring to FIG. 3 only the components 35 on the left side need cooling. The perforation 19 is then consequently adapted to concentrate the cooling gas flow 10 on the components 35 on the left. In the example of FIG. 4 the components 35 on the right need more cooling than the components 35 on the left. Accordingly, the perforation 19 is adapted to emphasize the cooling of the components 35 on the right.

In the depicted example the separation unit 13, i.e. the separation wall 13, comprises at least one permeable portion and at least one impermeable portion, said portions provided in this example by the arrangement of the holes of the perforation 19. With help of a suitable allocation of the permeable and the impermeable portions the separation unit 13 can be adapted to specific cooling requirements of the current arrangement of components 35.

The adaptation of the separation wall 13 to the current cooling requirements of the components 35 currently arranged within the component area 21 is preferably performed by at least one feature of a group the following features:

choosing a suitable shape of the at least one hole of the perforation 19, choosing a suitable number of the holes of the perforation 19, choosing a suitable positioning of the at least one hole of the perforation 19, choosing a suitable cross sectional area of the at least one hole of the perforation 19.

FIG. 4 depicts another specific embodiment, as the separation wall 13 is shorter than in the other examples. In particular, the length of the separation wall 13 is shorter than the length of the channel area 20. Therefore, it is possible to use at least a portion 36 of the channel area 20 for arranging the components 35, too. In the given example, one large component 35 extends into the portion 36 of the channel area 20. It is obvious that this large component 35 does not need much cooling. Since the separation wall 13 is removable also a specific type of insert module 1 may have no separation wall 13 such that the whole channel area 20 may be used for arranging components 35.

What is claimed is:

1. An insert module adapted to be inserted into a device, comprising:

a housing having a component area adapted for bearing one or more components, preferably at least one of a group comprising electronic and optical components, and a channel area communicating with at least one of an entrance and an exit of a cooling medium flow, wherein the insert module, when inserted into the device, provides at least a part of a flow path of the cooling medium flow, such that the cooling medium enters the insert module through the entrance, flows at least partly through the insert module, thereby at least partly passing the component area, and at least partly exits the insert module through the exit, wherein at least one permeable separation unit is adapted for separating the component area from the channel area, and wherein the separation unit comprises at least one permeable portion and at least one impermeable portion, and wherein an allocation of the at least one permeable portion and the at least one impermeable portion is adapted to the cooling requirements of the one or more components arranged within the component area.

2. The insert module according to claim 1, wherein the permeability of the separation unit is provided by a perforation comprising at least one hole.

3. The insert module according to claim 2, wherein the perforation of the separation unit is adapted to the cooling requirements of the one or more components arranged within the component area.

4. The insert module according to claim 2, wherein a shape of the at least one hole, is adapted to the cooling requirements of the one or more components arranged within the component area.

5. The insert module according to claim 2, wherein at a number of the holes is adapted to the cooling requirements of the one or more components arranged within the component area.

6. The insert module according to claim 2, wherein a positioning of the at least one hole, is adapted to the cooling requirements of the one or more components arranged within the component area.

7. The insert module according to claim 2, wherein a cross sectional area of the at least one hole, is adapted to the cooling requirements of the one or more components arranged within the component area.

8. The insert module according to claim 1, wherein the channel area extends within the housing alongside an outer side wall of the housing.

9. The insert module according to claim 1, wherein the channel area is arranged within the housing such that the cooling medium flow entering the channel area turns about 90° before leaving the channel area.

10. The insert module according to claim 1, wherein:

the housing has a long and flat shape such that a length of the housing is greater than its height and its breadth and such that the height of the housing is greater than its breadth, the channel area extends within the housing along the upside or along the underside of the housing, and extends alongside the housings length and alongside the housings breadth.

11. The insert module according to claim 1, wherein:

the separation unit is supported by a support comprising two longitudinal grooves, which face each other and in which the separation unit is inserted at its edges, the housing has an outer side wall adapted for providing a removable cap, the removed cap provides an opening, through which the separation unit can be inserted into the grooves and be removed out of the grooves.

12. The insert module according to claim 1, wherein:

a portion of the housing comprises the channel area and a support adapted for supporting the separation unit, said portion of the housing is formed in one piece.

13. The insert module according to claim 12, wherein the one-piece portion of the housing comprises at least two adjacent outer side walls of the housing.

14. The insert module according to claim 12, wherein the one-piece portion of the housing is formed by extrusion molding.

15. The insert module according to claim 1, wherein:

the separation unit is removed or has a length less than the length of the channel area, at least one component of the component area extends into the channel area.

16. The insert module according to claim 1, wherein the insert module is adapted to be inserted into a modular measurement device.

17. The insert module according to claim 1, wherein the separation unit is a separation wall.

18. The insert module according to claim 1, wherein the cooling medium is a gaseous or liquid cooling medium.

19. The insert module according to claim 1, wherein at least one of the at least one permeable separation unit is designed to be removable from the insert module.

20. A method for cooling components arranged within an insert module adapted to be inserted into a device, comprises:

using a permeable separation unit in the insert module for separating a component area adapted for bearing one or more components, preferably at least one of a group comprising electronic and optical components, from a channel area communicating with at least one of an entrance and an exit of a cooling medium flow, inserting the insert module into the device such that the insert module provides at least a part of a flow path of the cooling medium flow, such that the cooling medium enters the insert module through the entrance, flows at least partly through the insert module, thereby at least partly passing the component area, and at least partly exits the insert module through the exit, and allocating at least one permeable portion and at least one impermeable portion in the separation unit adapted to the cooling requirements of the one or more components arranged within the component area.

21. A method for adapting an insert module, which is adapted to be inserted into a device, to cooling requirements of components arranged within the insert module, wherein a permeable separation unit in the insert module is used for separating a component area adapted for bearing one or more components, preferably at least one of a group comprising electronic and optical components, from a channel area communicating with at least one of an entrance and an exit of a cooling medium flow, wherein the insert module, when inserted into the device, provides at least a part of a flow path of the cooling medium flow, such that the cooling medium enters the insert module through the entrance, flows at least partly through the insert module, thereby at least partly passing the component area, and at least partly exits the insert module through the exit, wherein the design of the separation unit is chosen according to the cooling requirements of the components currently arranged within the component area.

22. The method of claim 20, wherein the insert module comprises a housing including the component area; and the channel area.

23. The method of claim 21, wherein the insert module comprises:

a housing including the component area;

the channel area; and a separation wall including the permeable separation wall.

* * * * *